(12) United States Patent
Liu et al.

(10) Patent No.: US 11,495,646 B2
(45) Date of Patent: Nov. 8, 2022

(54) DEVICE SUBSTRATE WITH ASYMMETRICAL FAN-OUT LINES AND SPLICED ELECTRONIC APPARATUS USING THE SAME

(71) Applicant: Au Optronics Corporation, Hsinchu (TW)

(72) Inventors: Chan-Jui Liu, Hsinchu (TW); Chun-Cheng Cheng, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 449 days.

(21) Appl. No.: 16/439,722

(22) Filed: Jun. 13, 2019

(65) Prior Publication Data
US 2020/0295107 A1    Sep. 17, 2020

(30) Foreign Application Priority Data
Mar. 15, 2019    (TW) .................. 108108862

(51) Int. Cl.
*H01L 27/32* (2006.01)
*G02F 1/1333* (2006.01)
*G02F 1/1345* (2006.01)

(52) U.S. Cl.
CPC ...... *H01L 27/3253* (2013.01); *G02F 1/13336* (2013.01); *G02F 1/13452* (2013.01);
(Continued)

(58) Field of Classification Search
CPC ...... G09G 3/2092; G09G 3/2096; G09G 3/32; G09G 3/3208; G09G 3/3225; G09G 3/3266; G09G 3/3275; G09G 3/36; G09G 3/3611; G09G 3/3648; G09G 3/3674; G09G 3/3677; G09G 3/3685; G09G 3/3688;
(Continued)

(56) References Cited

U.S. PATENT DOCUMENTS 6,252,564 B1    6/2001    Albert et al.
6,881,946 B2    4/2005    Cok et al.
(Continued)

FOREIGN PATENT DOCUMENTS

CN    1607871    4/2005
CN    105209967    12/2015
(Continued)

*Primary Examiner* — Keith L Crawley
(74) *Attorney, Agent, or Firm* — JCIPRNET

(57) ABSTRACT

A device substrate includes a carrier, a device array, first fan-out lines, and second fan-out lines. The carrier has a first side, a second side, a third side, and a fourth side. The first side is opposite to the second side. The third side is opposite to the fourth side. The device array is disposed on a first surface of the carrier. The device array includes sub-pixels. Each of the sub-pixels includes a switching element and an optoelectronic element electrically connected with the switching element. The first fan-out lines are extending from the first side to the first surface and electrically connected with the device array. The second fan-out lines are extending from the second side to the first surface and electrically connected with the device array. The first fan-out lines and the second fan-out lines are asymmetrically disposed on the first side and the second side, respectively.

12 Claims, 8 Drawing Sheets

(52) U.S. Cl.
CPC ...... *H01L 27/3276* (2013.01); *H01L 27/3293* (2013.01); *G09G 2300/026* (2013.01); *G09G 2300/0426* (2013.01)

(58) Field of Classification Search
CPC ...... G09G 2300/026; G09G 2300/0426; G02F 1/13336; G02F 1/13452; G02F 1/1345; G02F 2001/133354; H05K 1/028; G06F 3/1446; H01L 27/3244; H01L 27/3253; H01L 27/3255; H01L 27/3267; H01L 27/3276; H01L 27/3293
See application file for complete search history.

(56) References Cited

U.S. PATENT DOCUMENTS

| | | |
|---|---|---|
| 6,897,855 B1 | 5/2005 | Matthies et al. |
| 10,910,410 B2 | 2/2021 | Zhu |
| 2003/0234343 A1* | 12/2003 | Cok ................. G09F 9/3026 250/208.1 |
| 2005/0078066 A1* | 4/2005 | Kim ................. G09G 3/3266 345/80 |
| 2007/0002243 A1 | 1/2007 | Kim |
| 2010/0065832 A1* | 3/2010 | Sugimoto ......... H01L 27/3293 257/40 |
| 2016/0014882 A1 | 1/2016 | Jongman et al. |
| 2017/0148374 A1 | 5/2017 | Lee et al. |
| 2018/0247989 A1* | 8/2018 | An .................. H01L 27/3276 |
| 2019/0244976 A1* | 8/2019 | Zhu ................. H01L 27/1218 |
| 2019/0386089 A1* | 12/2019 | Hsu ................. H01L 27/3293 |

FOREIGN PATENT DOCUMENTS

| | | |
|---|---|---|
| CN | 206115896 | 4/2017 |
| CN | 108122497 | 6/2018 |
| KR | 20170059523 | 5/2017 |
| TW | 200402670 | 2/2004 |
| TW | 201611693 | 3/2016 |

\* cited by examiner

DEVICE SUBSTRATE WITH ASYMMETRICAL FAN-OUT LINES AND SPLICED ELECTRONIC APPARATUS USING THE SAME

CROSS-REFERENCE TO RELATED APPLICATION

This application claims the priority benefit of Taiwan application serial no. 108108862, filed on Mar. 15, 2019. The entirety of the above-mentioned patent application is hereby incorporated by reference herein and made a part of this specification.

BACKGROUND OF THE INVENTION

1. Field of the Invention

The invention relates to a device substrate, and more particularly, to a spliced electronic apparatus having two said device substrates.

2. Description of Related Art

With the rapid development of display technology, there is an increasing demand for large format displays (LFD). Currently, a splicing technology is one of the main ways to realize the large format display.

The splicing technique is to form the large format display by splicing a plurality of smaller-sized substrates. Since a peripheral region on each substrate must retain a space for setting circuits, a picture seam will appear at the space for setting circuits on the large format display, resulting in a discontinuous picture. Accordingly, there is an urgent need for a solution to the above problem.

SUMMARY OF THE INVENTION

The invention provides a device substrate capable of solving the problem of oversize seam.

The invention provides a spliced electronic apparatus capable of solving the problem of oversize seam.

At least one embodiment of the invention provides a device substrate. The device substrate includes a carrier, a device array, a plurality of first fan-out lines, and a plurality of second fan-out lines. The carrier has a first side, a second side, a third side, and a fourth side. The first side is opposite to the second side, and the third side is opposite to the fourth side. The device array is disposed on a first surface of the carrier. The device array includes sub-pixels. Each of the sub-pixels includes a switching element and an optoelectronic element electrically connected with the switching element. The first fan-out lines are extending from the first side of the carrier to the first surface of the carrier and electrically connected with the device array. The second fan-out lines are extending from the second side of the carrier to the first surface of the carrier and electrically connected with the device array. The first fan-out lines and the second fan-out lines are asymmetrically disposed on the first side and the second side, respectively.

At least one embodiment of the invention provides a spliced electron apparatus. The spliced electronic apparatus includes two said device substrates. The first side of one of the two device substrates is adjacent to the second side of another one of the two device substrates.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
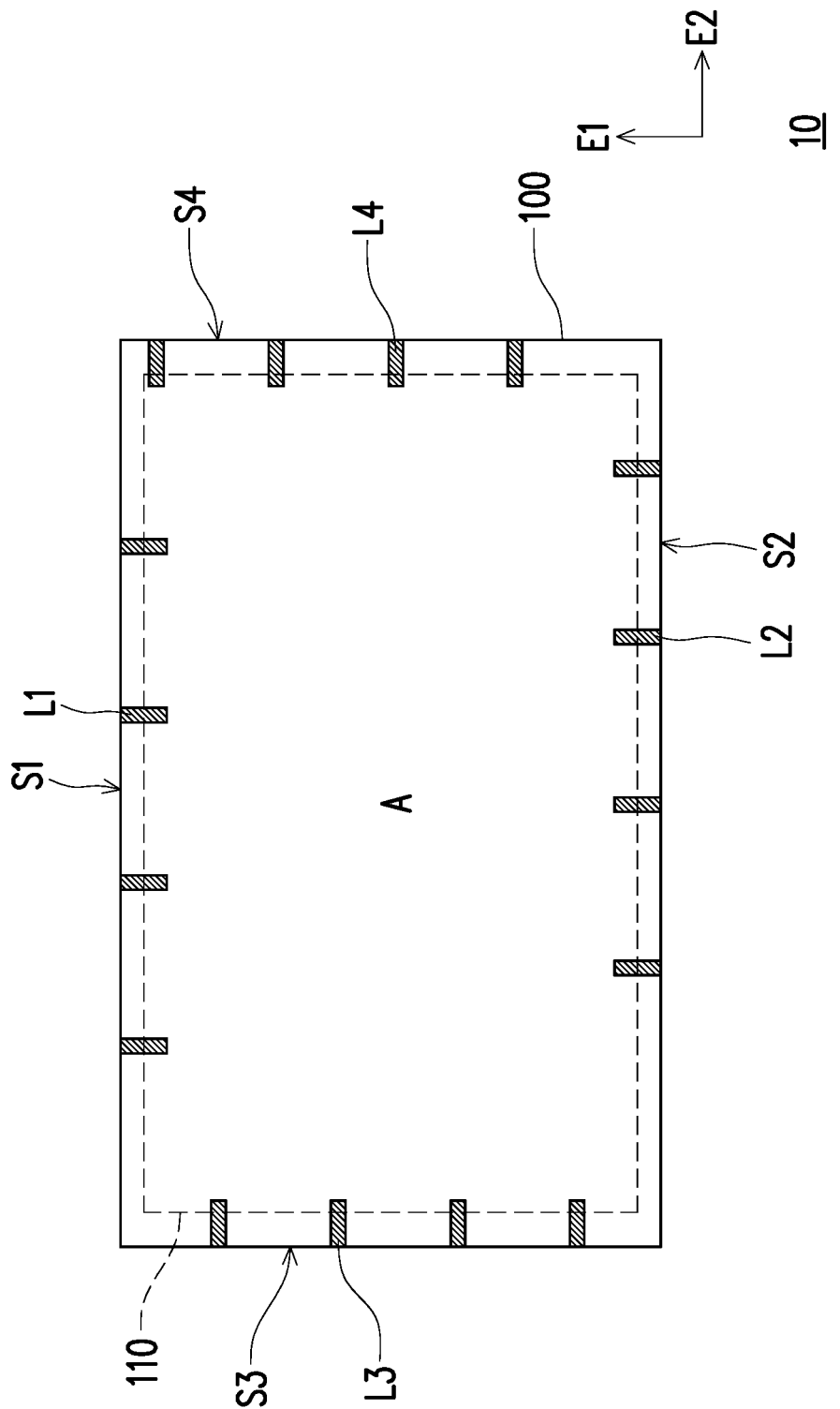
FIG. 1 is a top view of a device substrate according to an embodiment of the invention.

Reference will now be made in detail to the present preferred embodiments of the disclosure, examples of which are illustrated in the accompanying drawings. Wherever possible, the same reference numbers are used in the drawings and the description to refer to the same or like parts.

FIG. 1 is a top view of a device substrate according to an embodiment of the invention.

Figure 2:
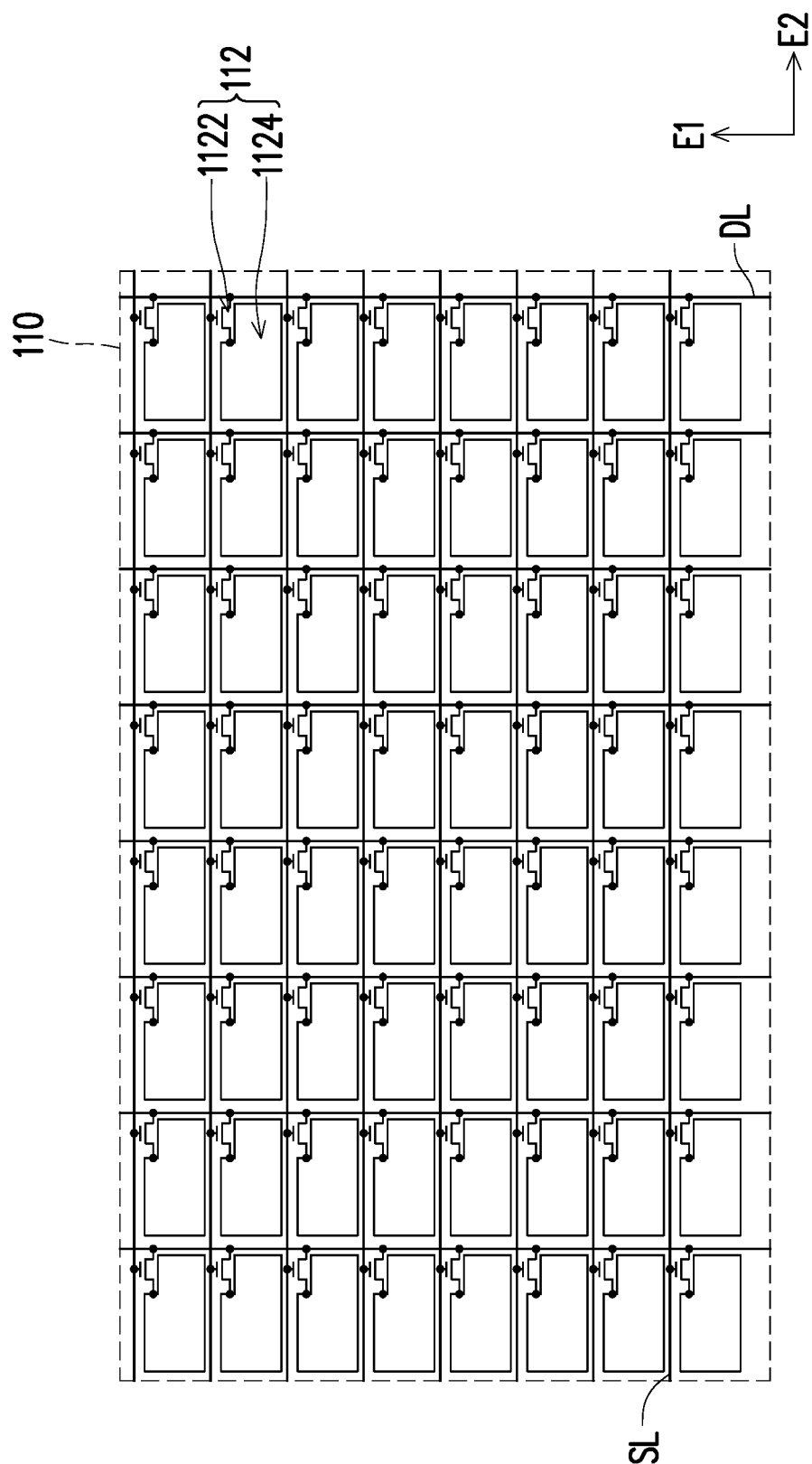
FIG. 2 is a top view of a device array according to an embodiment of the invention.

FIG. 2 is a top view of a device array according to an embodiment of the invention. For illustrative convenience, the specific structure of the element array is omitted in FIG. 1.

With reference to FIG. 1 and FIG. 2, a device substrate 10 includes a carrier 100, a device array 110, a plurality of first fan-out lines L1, and a plurality of second fan-out lines L2. In this embodiment, the device substrate 10 further includes a plurality of third fan-out lines L3 and a plurality of fourth fan-out lines L4.

The carrier 100 has a first side S1, a second side S2, a third side S3, and a fourth side S4. The first side S1 is opposite to the second side S2, and the third side S3 is opposite to the fourth side S4. The carrier 100 may be made of a glass, a quartz, an organic polymer or an opaque/reflective material (e.g., a conductive material, a metal, a wafer, a ceramic, or other applicable materials) or other applicable materials. If the conductive material or the metal is used, the carrier 100 will be covered with an insulation layer (not illustrated) to avoid short circuit problems.

The device array 110 is disposed on a first surface A of the carrier. The device array 110 includes a plurality of sub-pixels 112. Each of the sub-pixels 112 includes a switching element 1122 and an optoelectronic element 1124. The optoelectronic element 1124 includes a self-luminous element or a non self-luminous element. For instance, the optoelectronic element 1124 includes a light-emitting diode, a pixel electrode, a light sensor or other elements. In this embodiment, the device substrate 110 further includes a plurality of scan lines SL and a plurality of data lines DL. The scan line SL is electrically connected with a gate of the corresponding switching element 1122, and the data line DL is electrically connected with a source of the corresponding switching element 1122. The optoelectronic element 1124 is electrically connected with a drain of the switching element 1122.

The first fan-out lines L1 are extending from the first side S1 of the carrier 100 to the first surface A of the carrier 100 and electrically connected with the device array 110. The second fan-out lines L2 are extending from the second side S2 of the carrier 100 to the first surface A of the carrier 100 and electrically connected with the device array 110. The first fan-out lines L1 and the second fan-out lines L2 are electrically connected with the scan lines SL or the data lines DL of the device array 110. For instance, the first fan-out lines L1 are electrically connected with a part of the data lines DL, and the second fan-out lines L2 are electrically connected with another part of the data lines DL. In other embodiments, the first fan-out lines L1 are electrically connected with a part of the scan lines SL, and the second fan-out lines L2 are electrically connected with another part of the scan lines SL. The first fan-out lines L1 and the second fan-out lines L2 electrically connect the device array 110 to a driving circuit (not illustrated), and the driving circuit is located on a second surface (a back surface) of the carrier 100 opposite to the first surface A. In this way, a size of a peripheral region of the carrier 100 may be reduced so that the device substrate 10 has the advantage of narrow borders or borderless.

The first fan-out lines L1 and the second fan-out lines L2 are asymmetrically disposed on the first side S1 and the second side S2, respectively. The first fan-out lines L1 are extending on the first surface A of the carrier 100 along a first extending direction E1, and at least part of the first fan-out lines L1 are not overlapped with the second fan-out lines L2 in the first extending direction E1. In this embodiment, both the first fan-out lines L1 and the second fan-out lines L2 are extending from the first surface A of the carrier 100 along the first extending direction E1. The data lines DL are, for example, extending along the first extending direction E1.

The third fan-out lines L3 are extending from the third side S3 of the carrier 100 to the first surface A of the carrier 100 and electrically connected with the device array 110. The fourth fan-out lines L4 are extending from the fourth side S4 of the carrier 100 to the first surface A of the carrier 100 and electrically connected with the device array 110. The third fan-out lines L3 and the fourth fan-out lines L4 are electrically connected with the scan lines SL or the data lines DL of the device array 110. For instance, the third fan-out lines L3 are electrically connected with a part of the scan lines SL, and the fourth fan-out lines L4 are electrically connected with another part of the scan lines SL. In other embodiments, the third fan-out lines L3 are electrically connected with a part of the data lines DL, and the fourth fan-out lines L4 are electrically connected with another part of the data lines DL. The third fan-out lines L3 and the fourth fan-out lines L4 electrically connect the device array 110 to the driving circuit (not illustrated), and the driving circuit is located on the second surface (the back surface) of the carrier 100 opposite to the first surface A. In this way, a size of a peripheral region of the carrier 100 may be reduced so that the device substrate 10 has the advantage of narrow borders or borderless.

The third fan-out lines L3 and the fourth fan-out lines L4 are asymmetrically disposed on the third side S3 and the fourth side S4, respectively. The third fan-out lines L3 are extending on the first surface A of the carrier 100 along a second extending direction E2, and at least part of the third fan-out lines L3 are not overlapped with the fourth fan-out lines L4 in the second extending direction E2. In this embodiment, both the third fan-out lines L3 and the fourth fan-out lines L4 are extending from the first surface A of the carrier 100 along the second extending direction E2. The scan lines SL are, for example, extending along the second extending direction E2.

The first fan-out lines L1, the second fan-out lines L2, the third fan-out lines L3 and the fourth fan-out lines L4 are bent from the surface A of the carrier 100 to the second surface (the back surface) of the carrier 100 opposite to the first surface A.

Figure 3A:
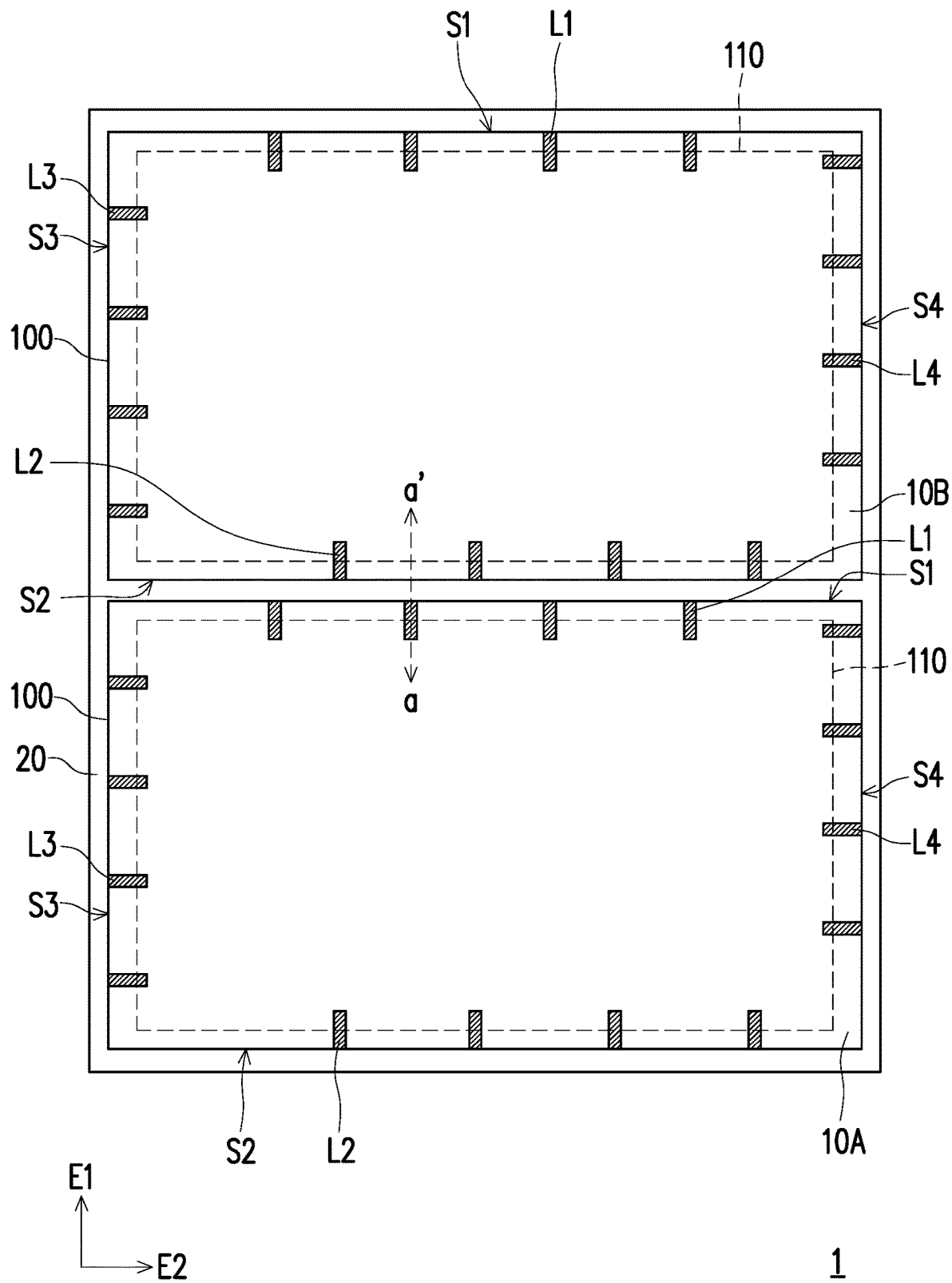
FIG. 3A is a top view of a spliced electronic apparatus according to an embodiment of the invention.
Figure 3B:
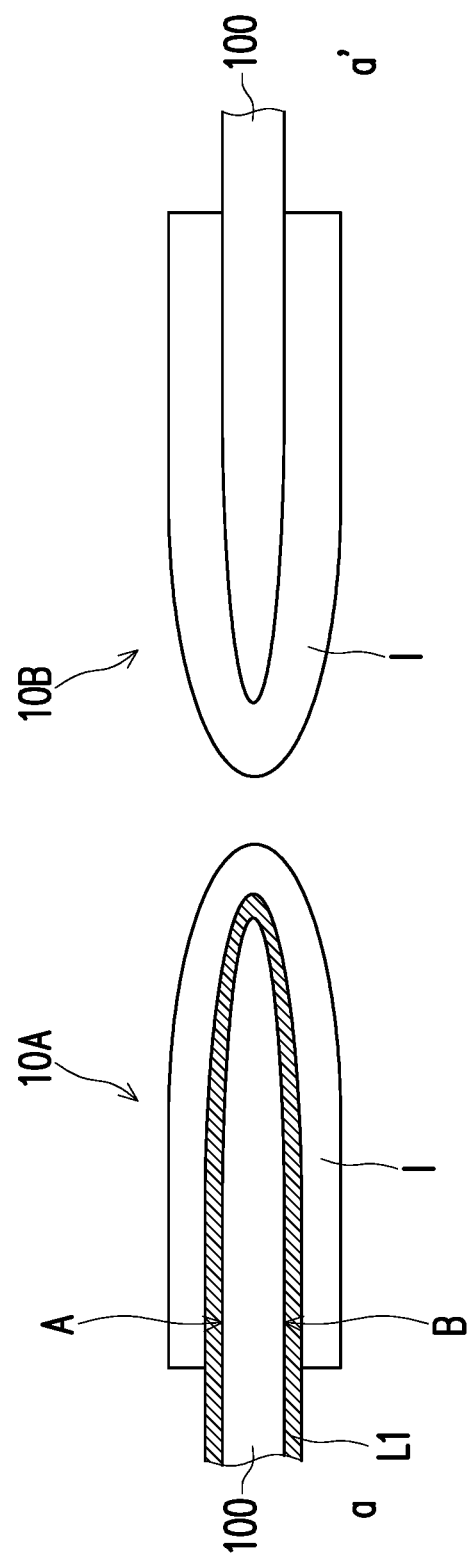
FIG. 3B is a cross-sectional view taken along a section line aa' of FIG. 3A.

FIG. 3A is a top view of a spliced electronic apparatus according to an embodiment of the invention. FIG. 3B is a cross-sectional view taken along a section line aa' of FIG. 3A. For descriptive convenience, FIG. 3A omits an insulation layer I of FIG. 3B, and FIG. 3B omits a fixing member 20 in FIG. 3A. It should be noted that, the embodiment of FIG. 3A and FIG. 3B adopts the reference numbers and part of the content in the embodiments of FIG. 1 and FIG. 2, where identical or similar reference numbers are used to indicate identical or similar components, and repeated description for the same technical contents is omitted. The omitted description can refer to the foregoing embodiment, which is not repeated hereinafter.

With reference to FIG. 3A and FIG. 3B, a spliced electronic apparatus 1 includes two device substrates. In this embodiment, the spliced electronic apparatus 1 includes a device substrate 10A and a device substrate 10B. In this embodiment, the spliced electronic apparatus 1 further includes the fixing member 20. In certain embodiments, the device substrate 10A and the device substrate 10B are combined together by the fixing member 20. In certain embodiments, the fixing member 20 includes, for example, two parts installed on the device substrate 10A and the device substrate 10B, respectively, so the two parts of the fixing member 20 can be combined with each other. In certain embodiments, the device substrate 10A and the device substrate 10B are commonly secured to the fixing member 20 being a single piece.

The first side of one of the two device substrates is adjacent to the second side of another one of the two device substrates. The first fan-out lines of one of the two device substrates are asymmetric to the second fan-out lines of another one of the two device substrates. In this embodiment, the first side S1 of the device substrate 10A is adjacent to the second side S2 of the device substrate 10B. The first fan-out lines L1 of the device substrate 10A are asymmetric to the second fan-out lines L2 of the device substrate 10B. The first fan-out lines L1 of the device substrate 10A are not overlapped with the second fan-out lines L2 of the device substrate 10B in the first extending direction E1. Since the fan-out lines L1 and the second fan-out lines L2 are asymmetric to each other, the problem of signal coupling between the first fan-out lines L1 and the second fan-out lines L2 may be solved. Accordingly, the seam between the device substrate 10A and the device substrate 10B may also be smaller.

In this embodiment, the device substrate 10A and the device substrate 10B further include the insulation layer I covering the first fan-out lines L1, the second fan-out lines L2, the third fan-out lines L3 and the fourth fan-out lines L4. The insulation layer I is extending from the first surface A of the carrier 100 to a second surface B of the carrier 100 opposite to the first surface A, so as to cover the first fan-out lines L1, the second fan-out lines L2, the third fan-out lines L3 and the fourth fan-out lines L4 located on the first side S1, the second side S2, the third side S3 and the fourth side S4, respectively.

Figure 4A:
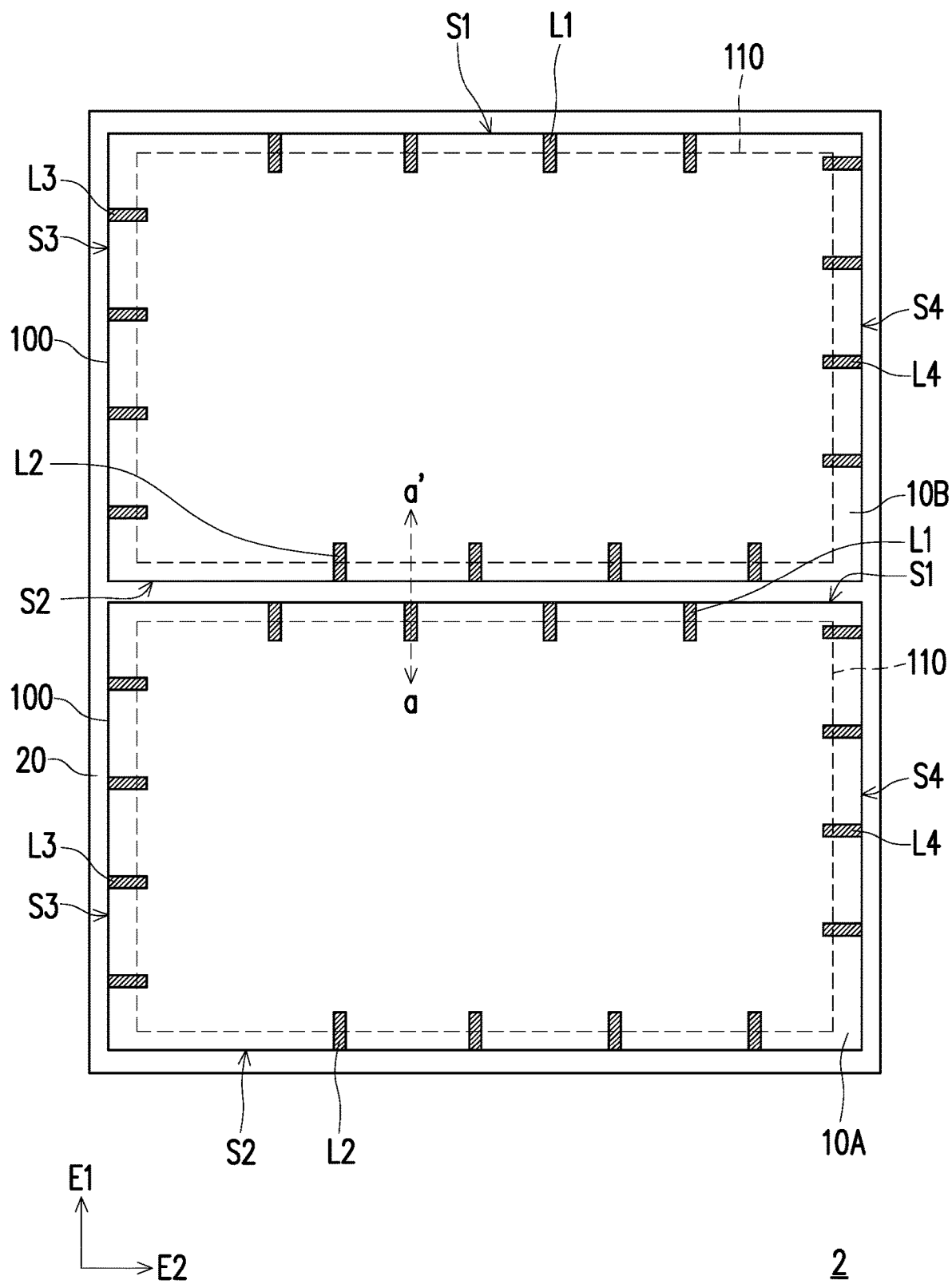
FIG. 4A is a top view of a spliced electronic apparatus according to an embodiment of the invention.
Figure 4B:
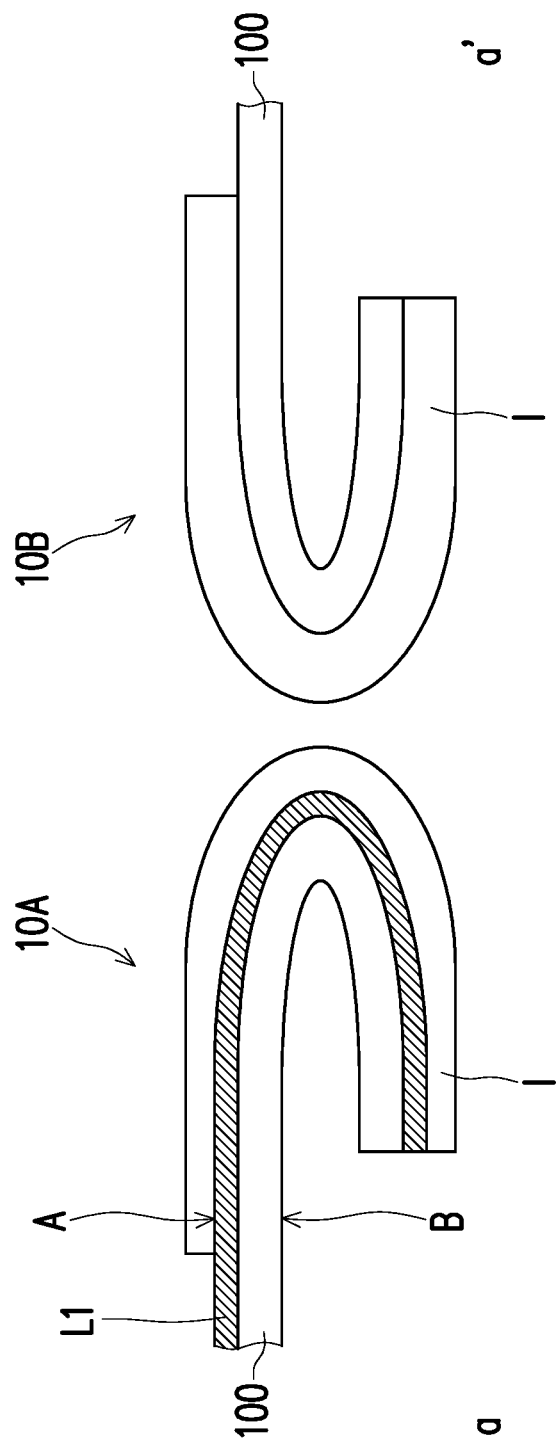
FIG. 4B is a cross-sectional view taken along a section line aa' of FIG. 4A.

FIG. 4A is a top view of a spliced electronic apparatus according to an embodiment of the invention. FIG. 4B is a cross-sectional view taken along a section line aa' of FIG. 4A. For descriptive convenience, FIG. 4A omits an insulation layer I of FIG. 4B, and FIG. 4B omits a fixing member 20 in FIG. 4A. It should be noted that, the embodiment of FIG. 4A and FIG. 4B adopts the reference numbers and part of the content in the embodiments of FIG. 3A and FIG. 3B, where identical or similar reference numbers are used to indicate identical or similar components, and repeated description for the same technical contents is omitted. The omitted description can refer to the foregoing embodiment, which is not repeated hereinafter.

A major difference between a spliced electronic apparatus 2 of FIG. 4A and FIG. 4B and the spliced electronic apparatus 1 of FIG. 3A and FIG. 3B is that, the carrier 100 of the device substrate 10A of the spliced electronic apparatus 2 is bent at the first side S1.

With reference to FIG. 4A and FIG. 4B, the carriers 100 of the device substrate 10A and the device substrate 10B are flexible carriers, the carrier 100 of the device substrate 10A is bent at the first side S1, and the carrier 100 of the device substrate 10B is bent at the second side S2.

In this embodiment, the first fan-out lines L1, the second fan-out lines L2, the third fan-out lines L3 and the fourth fan-out lines L4 of the device substrate 10A and the device substrate 10B are all formed on the first surfaces A of the carriers 100, and the carriers 100 of the device substrate 10A and the device substrate 10B are bent backwards from the first side S1, the second side S2, the third side S3 and the fourth side S4. By bending the carriers 100 at the first side S1, the second side S2, the third side S3 and the fourth side S4, border areas of the device substrate 10A and the device substrate 10B may be smaller, and the seam between the device substrate 10A and the device substrate 10B may be less obvious.

Figure 5A:
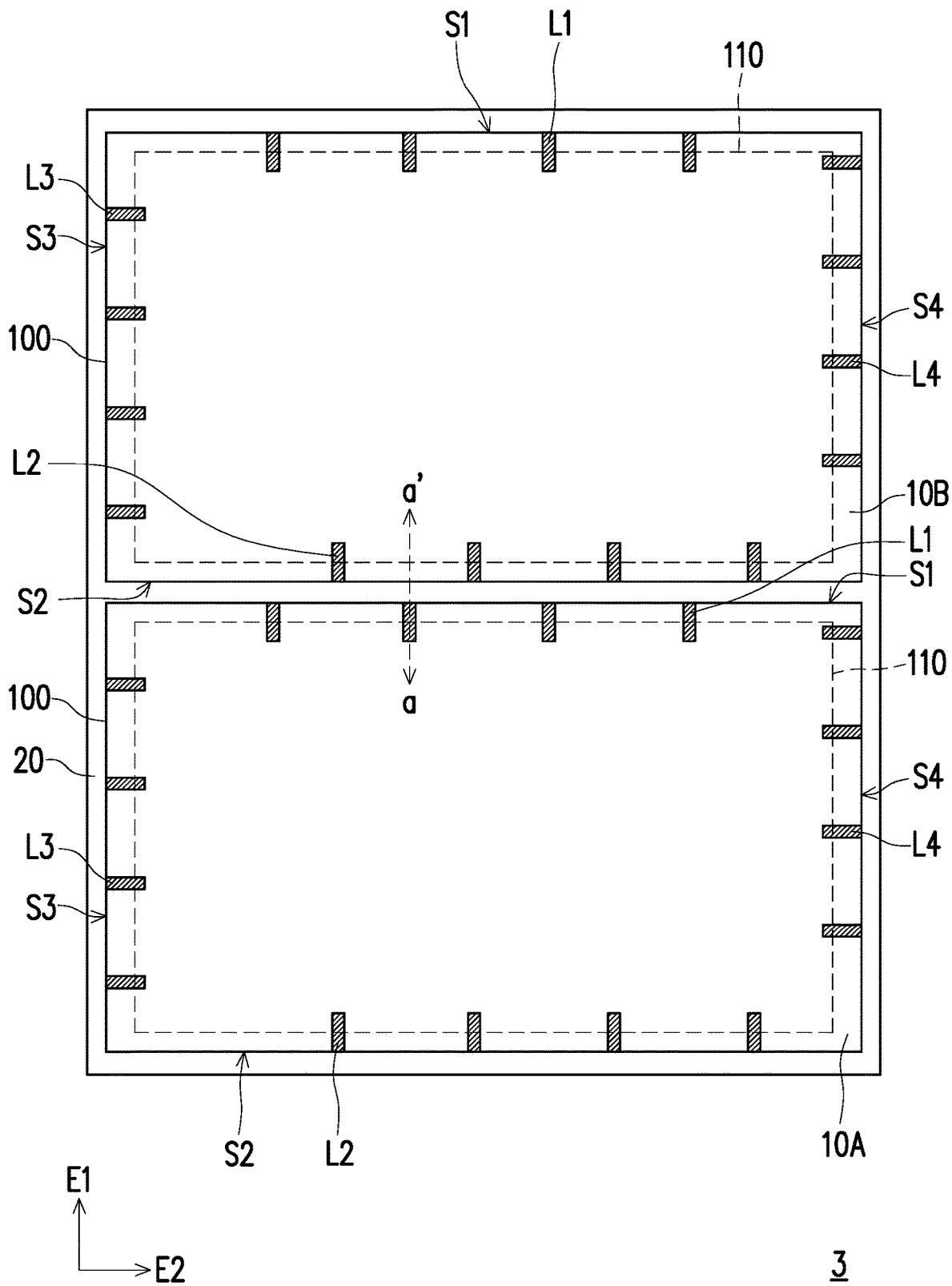
FIG. 5A is a top view of a spliced electronic apparatus according to an embodiment of the invention.
Figure 5B:
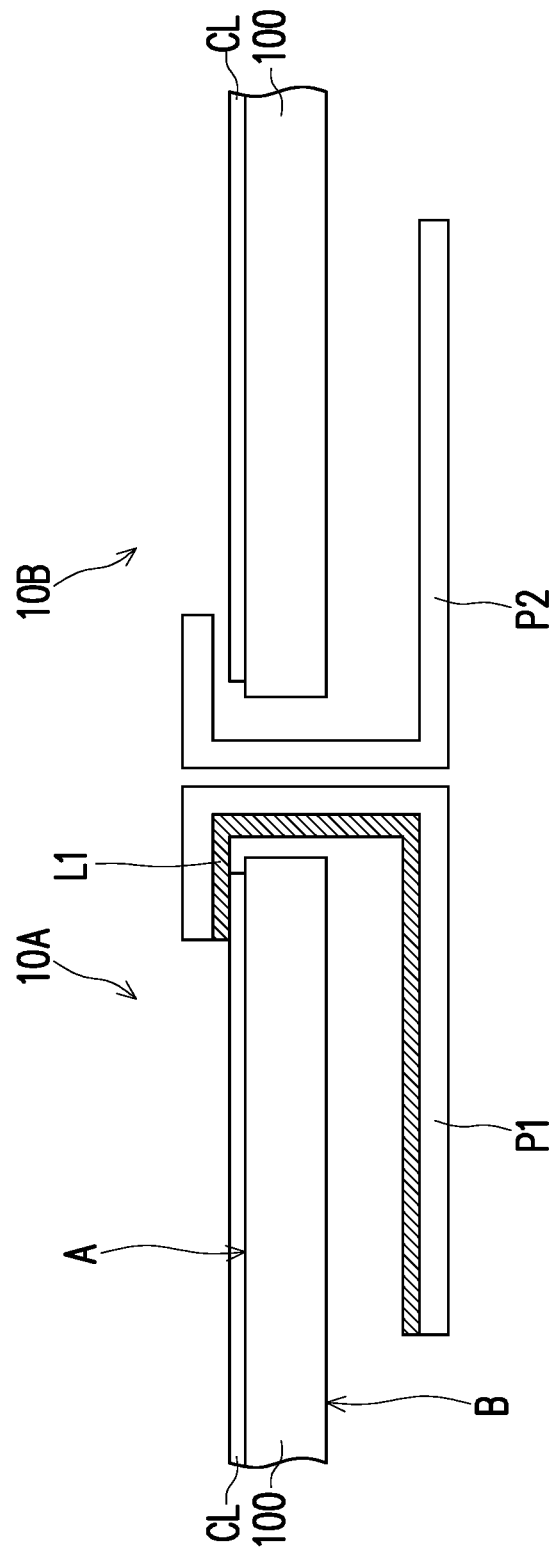
FIG. 5B is a cross-sectional view taken along a section line aa' of FIG. 5A.

FIG. 5A is a top view of a spliced electronic apparatus according to an embodiment of the invention. FIG. 5B is a cross-sectional view taken along a section line aa' of FIG. 5A. For descriptive convenience, FIG. 5A omits a first flexible printed circuit board P1, a second flexible printed circuit board P2 and conduction lines CL of FIG. 5B, and FIG. 5B omits the fixing member 20 in FIG. 5A. It should be noted that, the embodiment of FIG. 5A and FIG. 5B adopts the reference numbers and part of the content in the embodiments of FIG. 3A and FIG. 3B, where identical or similar reference numbers are used to indicate identical or similar components, and repeated description for the same technical contents is omitted. The omitted description can refer to the foregoing embodiment, which is not repeated hereinafter.

A major difference between a spliced electronic apparatus 3 of FIG. 5A and FIG. 5B and the spliced electronic apparatus 1 of FIG. 3A and FIG. 3B is that, each of the device substrate 10A and the device substrate 10B includes the first flexible printed circuit board P1 and the second flexible printed circuit board P2.

The first flexible printed circuit board P1 is located on the first side S1 of the carrier 100, and bent from the first surface A of the carrier 100 to the second surface B of the carrier 100 opposite to the first surface A. Here, the first fan-out lines L1 are located on the first flexible printed circuit board P1, and the first fan-out lines L1 are electrically connected with the conduction lines CL (e.g., the scan lines or the data lines) on the carrier 100.

The second flexible printed circuit board P2 is located on the second side S2 of the carrier 100, and bent from the first surface A of the carrier 100 to the second surface B of the carrier 100 opposite to the first surface A. Here, the second fan-out lines L2 are located on the second flexible printed circuit board P2, and the second fan-out lines L2 are electrically connected with the conduction lines CL (e.g., the scan lines or the data lines) on the carrier 100.

A third flexible printed circuit board (not illustrated) is located on the third side S3 of the carrier 100, and bent from the first surface A of the carrier 100 to the second surface B of the carrier 100 opposite to the first surface A. Here, the third fan-out lines L3 are located on the third flexible printed circuit board, and the third fan-out lines L3 are electrically connected with the conduction lines CL (e.g., the scan lines or the data lines) on the carrier 100.

A fourth flexible printed circuit board (not illustrated) is located on the fourth side S4 of the carrier 100, and bent from the first surface A of the carrier 100 to the second surface B of the carrier 100 opposite to the first surface A. Here, the fourth fan-out lines L4 are located on the fourth flexible printed circuit board, and the fourth fan-out lines L4 are electrically connected with the conduction lines CL (e.g., the scan lines or the data lines) on the carrier 100.

In certain embodiments, each of the first flexible printed circuit board P1, the second flexible printed circuit board P2, the third flexible printed circuit board and the fourth flexible printed circuit board may be provided with a driving chip (not illustrated), but the invention is not limited thereto.

In certain embodiments, the first fan-out lines L1, the second fan-out lines L2, the third fan-out lines L3 and the fourth fan-out lines L4 may be electrically connected with the conduction lines CL respectively through conductive structures (e.g., solder materials, conductive paste or other conductive members).

In summary, as the first fan-out lines L1 and the second fan-out lines L2 are asymmetrically disposed on the first side S1 and the second side S2, respectively, the problem of oversize seam of the spliced electronic apparatus may be solved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A device substrate, comprising:
a carrier, having a first side, a second side, a third side, and a fourth side, wherein the first side is opposite to the second side, and the third side is opposite to the fourth side;
a device array, disposed on a first surface of the carrier, wherein the device array comprises a plurality of sub-pixels, and each of the plurality of sub-pixels comprises a switching element and an optoelectronic element electrically connected with the switching element;
a plurality of first fan-out lines, extending from a first edge of the first side of the carrier to the sub-pixels on the first surface of the carrier and electrically connected with the device array through a part of scan lines or a part of data lines of the device array; and a plurality of second fan-out lines, extending from a second edge of the second side of the carrier to the sub-pixels on the first surface of the carrier and electrically connected with the device array through another part of scan lines or another part of data lines of the device array, wherein the plurality of first fan-out lines and the plurality of second fan-out lines are asymmetrically disposed on the first side and the second side, respectively.

2. The device substrate according to claim 1, wherein the plurality of first fan-out lines are extending on the first surface of the carrier along a first extending direction, and at least part of the plurality of first fan-out lines are not overlapped with the plurality of second fan-out lines in the first extending direction.

3. The device substrate according to claim 1, further comprising:
a plurality of third fan-out lines, extending from a third edge of the third side of the carrier to the sub-pixels on the first surface of the carrier and electrically connected with the device array through a part of data lines or a part of scan lines of the device array; and
a plurality of fourth fan-out lines, extending from a fourth edge of the fourth side of the carrier to the sub-pixels on the first surface of the carrier and electrically connected with the device array through another part of data lines or another part of scan lines of the device array, wherein the plurality of third fan-out lines and the plurality of fourth fan-out lines are asymmetrically disposed on the third side and the fourth side, respectively,
wherein the plurality of third fan-out lines and the plurality of fourth fan-out lines are electrically connected with the data lines when the plurality of first fan-out lines and the plurality of second fan-out lines are electrically connected with the scan lines, and the plurality of third fan-out lines and the plurality of fourth fan-out lines are electrically connected with the scan lines when the plurality of first fan-out lines and the plurality of second fan-out lines are electrically connected with the data lines.

4. The device substrate according to claim 1, wherein the plurality of first fan-out lines and the plurality of second fan-out lines are electrically connected with scan lines or data lines of the device array.

5. The device substrate according to claim 1, wherein the optoelectronic element comprises a self-luminous element or a non self-luminous element.

6. The device substrate according to claim 1, wherein the carrier is a flexible carrier, and the carrier is bent at the first side.

7. The device substrate according to claim 1, further comprising:
a first flexible printed circuit board, located on the first side of the carrier, and bent from the first surface of the carrier through the first edge of the first side to a second surface of the carrier opposite to the first surface, wherein the plurality of first fan-out lines are located on the first flexible printed circuit board.

8. The device substrate according to claim 1, wherein the plurality of first fan-out lines are bent from the first surface of the carrier through the first edge of the first side to a second surface of the carrier opposite to the first surface.

9. A spliced electronic apparatus, comprising:
two said device substrates of claim 1, the first side of one of the two said device substrates being adjacent to the second side of another one of the two said device substrates.

10. The spliced electronic apparatus according to claim 9, wherein the plurality of first fan-out lines of one of the two said device substrates are asymmetric to the plurality of second fan-out lines of another one of the two said device substrates.

11. The spliced electronic apparatus according to claim 9, wherein each of the two said device substrates further comprises:
a plurality of third fan-out lines, extending from the third side of the carrier to the first surface of the carrier and electrically connected with the device array; and
a plurality of fourth fan-out lines, extending from the fourth side of the carrier to the first surface of the carrier and electrically connected with the device array, wherein the plurality of third fan-out lines and the plurality of fourth fan-out lines are asymmetrically disposed on the third side and the fourth side, respectively.

12. The spliced electronic apparatus according to claim 10, wherein the plurality of first fan-out lines of one of the two said device substrates are symmetrical to the plurality of first fan-out lines of the other one of the two said device substrates, and the plurality of second fan-out lines of one of the two said device substrates are symmetrical to the plurality of second fan-out lines of the other one of the two said device substrates.

\* \* \* \* \*